Aug. 12, 1958 I. GOLDMAN 2,847,624

SEMICONDUCTOR DEVICES AND METHODS

Filed Feb. 24, 1955

INVENTOR.
IRWIN GOLDMAN
BY Morton Amster
ATTORNEY 2,847,624
Patented Aug. 12, 1958

1

2,847,624

SEMICONDUCTOR DEVICES AND METHODS

Irwin Goldman, Malverne, N. Y., assignor to Sylvania Electric Products Inc., a corporation of Massachusetts Application February 24, 1955, Serial No. 490,269

13 Claims. (Cl. 317—236)

The present invention relates to semiconductor translators, particularly to rectifying and translating devices of a semiconductive germanium, and is concerned with novel methods of manufacturing such rectifying and translating devices having one or more rectifying contacts.

Germanium has long been employed in the manufacture of rectifiers and of recent times in the manufacture of transistors. Commonly, a point-contact rectifier includes a semiconductive body of germanium in highly purified state to which is added controlling impurities to attain a particular conductivity type and resistivity. A sharply pointed rectifying contact, as of tungsten, is engaged in pressure contact with a prepared surface of the germanium body, and an area connection is formed on the opposite surface of the germanium body. The rectifier package is completed by enclosing the contacted germanium body within an appropriate envelope or shell.

It is an object of the present invention to provide an improved method of processing rectifiers employing germanium as the semiconductive material.

In the manufacture of crystal rectifiers, there are a number of electrical properties which are of extreme importance, including recovery time. Crystal diodes having a short recovery time are desirable, in that they are capable of operation at comparatively high frequencies. An improvement in recovery time and the attendant capacity for high frequency operation are realized by making the semiconductive body exceptionally small. Known mechanical procedures for mounting the germanium semiconductive bodies impose lower size limits, and thus limit the ability to attain short recovery time and corresponding high frequency operation. Conventionally, germanium elements are processed by preparing a slab or wafer of germanium, and thereafter cutting the slab or wafer into a number of small, thin elements or dice. The elements or dice are soldered to individual metallic supports by known procedures and thereafter incorporated into the semiconductive package with the resilient rectifying contact or whisker.

It is a further object of the present invention to provide a novel method for preparing crystal rectifiers which have semiconductive bodies of minimum dimensions. To advantage, devices incorporating such germanium bodies have comparatively short recovery times, and make possible miniaturization of the rectifier packages.

In accordance with an illustrative embodiment demonstrating features of the present invention, a germanium diode is prepared by the electrodeposition of a thin layer or skin of germanium directly onto an electrode or contact to be incorporated in the completed germanium unit, followed by pressure contacting of the layer or skin of germanium with a further electrode or contact. The conductivity of the plated layer of germanium is appropriately controlled to attain required rectification properties, as by the addition of doping impurities. To advantage, the doping of the germanium skin or layer may be achieved by the application of a deposit of the doping agent on the electrode preliminary to the deposition of

2 the germanium skin or layer, or by the codeposition of germanium and a doping agent. Subsequent to the plating of the germanium onto the electrode to a desired thickness, heat treatment at appropriate temperatures diffuses the doping agent into the germanium.

Consideration of the illustrative embodiment indicates that the described techniques are applicable to the preparation of semiconductive devices embodying a number of rectifying contacts, such as employed in transistors. For example, a pair of electrodes in a desired spaced relation, may be precoated with a doping agent and placed within a bath capable of concurrently electrodepositing germanium onto the electrode pair. By proper control of the conductivity type of the plated material, and subsequent heat treatment, a barrier type of transistor may be prepared. Thus, it will be appreciated that the techniques described are particularly adaptable for the preparation of small-area junction-type transistors.

The above brief description, as well as further objects, features and advantages of the present invention may best be appreciated by reference to the following detailed description of a presently preferred method and several illustrative embodiments attainable thereby, when taken in conjunction with the accompanying drawings, wherein.

Although the following detailed description will make specific reference to the application of the invention to the preparation of semiconductive diode devices, it is to be expressly understood that the invention finds application in the preparation of semiconductive devices embodying several rectifying contacts, such as transistors.

Figure 1:
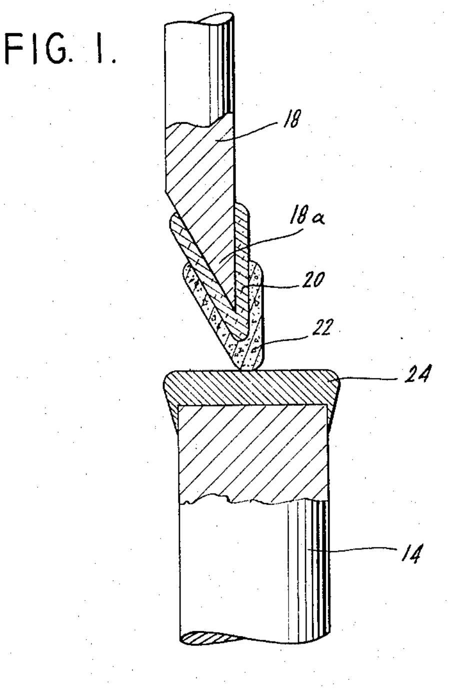
Fig. 1 is an elevational view, on a greatly enlarged scale and with parts broken away and sectioned, of the contact region of a crystal diode prepared in accordance with the present invention.
Figure 2:
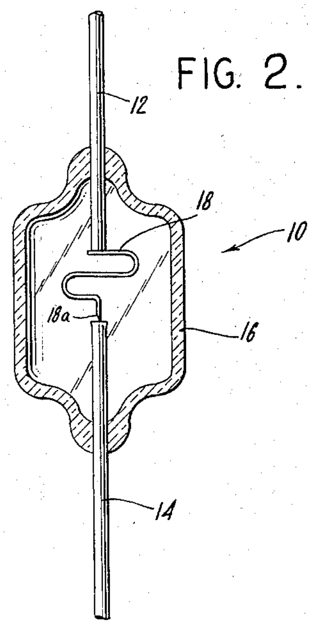
Fig. 2 is an elevational view, with parts sectioned, showing a completed crystal diode according to the present invention.

Referring now specifically to Figs. 1 and 2, there is shown a semiconductive diode 10 which includes leads 12, 14, sealed in spaced end-to-end alignment in a glass envelope 16. Secured to the inner end of the lead 12 is a resilient whisker 18, as of tungsten, having a sharply pointed end 18*a*. The end 18*a* of the whisker 18 may be pointed either mechanically or electrochemically by techniques which are well understood.

In accordance with the present invention, a deposit of a doping agent 20 is formed on the pointed end 18*a* of the whisker 18, following preliminary cleaning and surface treatment of the whisker. Thereafter, a thin layer or skin 22 of garmanium is electroplated onto the doping agent. Following heat treatment of the assembly to diffuse the doping agent into the germanium, the germanium layer 22 is contacted against a soft solder contact 24 formed on the adjacent end of the lead 14.

The details for processing diodes as described in conjunction with Figs. 1 and 2 are subject to a latitude of modification and substitution. As is well understood, the doping constituents may be the group III elements (gallium and indium), suitable to impart P-type conductivity, or the group IV elements (phosphorus, arsenic, antimony and bismuth), suitable to impart N-type conductivity. By appropriate selection of the doping constituent and the heat treatment cycle, the resistivity of the electroplated germanium 22 may be controlled to attain desired rectifying properties. The doping agent may be applied to the electrode by electrodeposition from an appropriate solution, by co-deposition as in the act of alloy electroplating, or by direct application (i. e. painting).

Among the methods suitable for electrodeposition of the germanium on the electrode 18 is a process in which a tungsten whisker 18 is made the cathode in a bath of germanium tetrachloride propylene glycol with a graphite anode. Starting with a bath having a concentration of approximately 7% by volume of germanium tetrachloride in propylene glycol and operating at a temperature of 59° C. and at a cathode current density of .4 ampere per square centimeter, a plating speed of the order of one thousandth of an inch in three hours is obtained. Germanium deposits of the order of one thousandth to five thousandths of an inch having good adherent properties are obtainable on the tungsten whisker, which deposits are of a magnitude sufficient to obtain rectifier operation.

The final assembly of the germanium plated whisker 18 with the lead 14 having the relatively soft solder contact 24 is achieved by the use of shadowgraph equipment, and preferably while observing a cathode ray presentation of the rectifier characteristic, such that prescribed electrical properties may be obtained.

Figure 3:
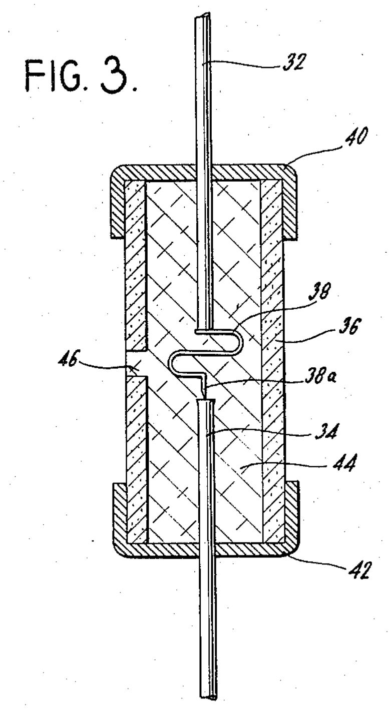
Fig. 3 is an elevational view, with parts sectioned, of a modified crystal diode prepared according to the present invention.

The packaging arrangement illustrated in Fig. 2 is but one of many contemplated for electrodeposited germanium bodies prepared according to the present invention. For example, and as shown in Fig. 3, leads 32, 34 may be assembled within a ceramic sleeve 36, with a germanium plated whisker 38 secured to the inner end of the lead 32 and having its pointed end 38*a* in pressure contact with an electrical conducting material, such as a soft solder contact on the adjacent inner end of the lead 34. The ceramic envelope is sealed at its ends by flanged end caps 40, 42, while a suitable wax potting compound 44 is introduced into the ceramic sleeve through an appropriate filling port or opening 46.

Figure 4:
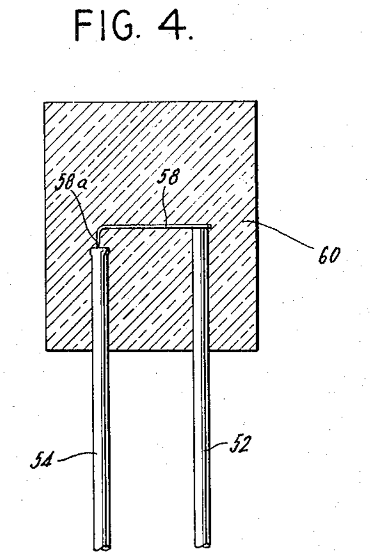
Fig. 4 is an elevational view, with parts sectioned, of a still further modified form of the present invention.

Further, packaging of the diode may take the form shown in Fig. 4 which illustrates a single-ended termination consisting of leads 52, 54 and whisker element 58 potted within a plastic body 60. The whisker element 58 is prepared with the pointed and plated contact end 58*a* and is in pressure contact with a suitable soft solder contact on the inner end of the lead 54.

Although for the purposes of illustration, the invention has been described in detail with respect to its application to the preparation of crystal diodes, particularly those characterized in the art as point-contact rectifiers, it is to be understood that the described device may also be envisioned as a junction-type rectifier. That is, upon appropriate heat treatment, there is formed a relatively small area contact or junction.

Illustrative of further applications of the present invention is a process for preparing transistors in which two electrodes, of a material suitable for the electrodeposition of germanium thereon, are provided with an appropriate doping agent of the same conductivity type. The doping agent, for example of the group III elements suitable to impart P-type conductivity, may be applied in a preliminary step, either mechanically or electrochemically as previously described. Thereupon the electrode pair in required spaced relation are immersed in an electrolytic solution suitable for plating out germanium onto the electrode pair. By properly spacing the electrodes, the germanium may be caused to build up about selected regions of the respective electrodes, the individual build ups being joined together by a medial portion of reduced section. The germanium built up will be of generally hour glass configuration depending upon the plating conditions, the spacing of the electrodes, and other variables. The two electrode assembly is then heat treated to diffuse the doping agent into the adjacent regions of germanium. By controlled heat treatment, such diffusion establishes within the plated germanium body regions of P-type conductivity separated by a region of N-type conductivity. The resultant structure is broadly equivalent to known barrier-type junctions with the electrodes providing electrical connections to the respective regions of P-type conductivity. Further techniques known to the electroplating art may be employed to control the shape of the germanium electro-deposit such as to obtain a desired configuration for the germanium body and one suitable for certain types of transistor applications. For example, by appropriate preplating germanium onto one of the electrodes, designated nominally as the collector electrode, before jointly plating both electrodes, it is possible to shape the germanium electrode deposit so that the deposit contiguous to the collector electrode is relatively larger, as compared to the deposit about the other electrode, which may be designated as the emitter electrode.

Other and further modifications are contemplated herein, and accordingly the appended claims should be construed broadly as is consistent with the disclosure; in some applications, certain features of the invention will be used without a corresponding use of other features.

What is claimed is:

1. In the manufacture of a translating device, the steps including depositing a doping agent onto a metallic electrode, electrolytically depositing a plating of germanium onto said electrode and heat treating the assembly to diffuse the doping agent into the plating of germanium.

2. In the manufacture of a crystal diode, the steps including depositing a doping agent onto an electrode, electrolytically depositing a plating of germanium onto said electrode, heat treating the assembly to diffuse said doping agent into said plating, and supporting the heat treated plating in electrical contact with a base electrode.

3. In the manufacture of a crystal diode, the steps including depositing a doping agent onto a metallic whisker, electrolytically depositing a thin plating of germanium onto said whisker, heat treating the assembly to diffuse said doping agent into said plating, forming an electrical contact to the heat treated plating of germanium, and hermetically enclosing the assembly of said metallic whisker and said electrical contact.

4. In the manufacture of semiconductor devices, the steps including electroplating a layer of germanium onto an electrode, and doping said layer with an impurity to impart prescribed semiconductor properties.

5. In the manufacture of semiconductor diodes, the steps including electroplating a layer of germanium onto an electrode, doping said layer with an impurity to obtain a prescribed resistivity and conductivity type, and assembling said plated electrode in contact with a further electrode.

6. In the manufacture of semiconductor devices, the steps including electroplating a layer of germanium onto a sharply pointed electrode, doping said layer with an impurity to impart prescribed semiconductor properties, and assembling said electrode in pressure contact with a soft solder contact.

7. As a new article of manufacture, a crystal diode including a metallic whisker, an electroplated germanium layer on said metallic whisker, and a further electrode of soft solder in pressure contact with said electroplated layer of said metallic whisker.

8. As a new article of manufacture, a crystal diode including a tungsten whisker, an electroplated layer of doped germanium in a contact region on said tungsten whisker, a base electrode contacting said electroplated layer, and a sealed envelope enclosing in said contact region.

9. In the manufacture of semiconductor translators, the steps including electrolytically depositing a layer of semiconductive material onto an electrode, treating said layer with an impurity to impart prescribed semiconductor properties thereto, and assembling said layer with a further electrode.

10. In the manufacture of a translating device, the steps including electrolytically depositing a layer of semiconductive material onto an electrode, heat treating said layer with an impurity to impart prescribed semiconductor properties thereto, forming an electrical contact to the heat treated layer, and enclosing the assembly of said electrode and said electrical contact.

11. In the manufacture of an area-junction transistor, the steps including applying a doping agent onto each of a pair of electrodes, electrolytically depositing a layer of semiconductive material onto said electrodes to build up an assembly having a semiconductive body joining together said electrodes, and heat treating said assembly to diffuse the doping agent on the respective electrodes into adjacent regions of said semiconductive body.

12. In the manufacture of an area-junction transistor, the steps including applying a doping agent onto each of a pair of electrodes, electrolytically depositing a layer of germanium onto said electrodes to build up an assembly having a germanium body joining together said electrodes, and heat treating said assembly to diffuse the doping agent on the respective electrodes into adjacent regions of said germanium body.

13. A semiconductor translator including an electrode pair, an electrodeposited semiconductive body on said electrode pair, said semiconductive body having regions of one conductivity type in contact with said electrode pair separated by a region of the opposite conductivity type.

References Cited in the file of this patent

UNITED STATES PATENTS 1,743,160 Presser ---------------- Jan. 14, 1930

FOREIGN PATENTS 682,105 Great Britain ------------- Nov. 5, 1952

OTHER REFERENCES

Trans. Elec. Chem. Soc. (1941), vol. 79, pp. 377–412.